(12) United States Patent
Oshige

(10) Patent No.: US 11,985,866 B2
(45) Date of Patent: May 14, 2024

(54) SEMICONDUCTOR APPARATUS HAVING FIRST AND SECOND BONDING MEMBERS, DISPLAY APPARATUS, PHOTOELECTRIC CONVERSION APPARATUS, ELECTRONIC DEVICE, ILLUMINATION APPARATUS, AND MOVING BODY

(71) Applicant: CANON KABUSHIKI KAISHA, Tokyo (JP)

(72) Inventor: Hidemasa Oshige, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/152,541

(22) Filed: Jan. 10, 2023

(65) Prior Publication Data

US 2023/0141503 A1 May 11, 2023

Related U.S. Application Data

(63) Continuation of application No. 16/997,259, filed on Aug. 19, 2020, now Pat. No. 11,569,319.

(30) Foreign Application Priority Data

Aug. 30, 2019 (JP) .................................. 2019-158969

(51) Int. Cl.
*H10K 59/123* (2023.01)
*H10K 59/131* (2023.01)

(52) U.S. Cl.
CPC ......... *H10K 59/123* (2023.02); *H10K 59/131* (2023.02)

(58) Field of Classification Search
CPC .......................... H10K 59/123; H10K 59/131
See application file for complete search history.

(56) References Cited

U.S. PATENT DOCUMENTS

| | | | |
|---|---|---|---|
| 2013/0313528 A1* | 11/2013 | So .................. | H10K 50/8426 438/23 |
| 2015/0097177 A1* | 4/2015 | Nishi ............... | H10K 50/82 257/40 |
| 2015/0171150 A1* | 6/2015 | Ha .................. | H10K 59/35 438/34 |

FOREIGN PATENT DOCUMENTS

| JP | 09-204981 A | 8/1997 |
|---|---|---|
| JP | 2003-109750 A | 4/2003 |

(Continued)

*Primary Examiner* — Lex H Malsawma
(74) *Attorney, Agent, or Firm* — CANON U.S.A., INC. IP Division

(57) ABSTRACT

A semiconductor apparatus includes an element substrate including an effective pixel region having a plurality of effective pixels on one principal surface side of a first substrate, and a peripheral region positioned around the effective pixel region, a second substrate, and a first and a second bonding member configured to bond the both substrates. The second bonding member includes a material different from that of the first bonding member. In a planar view with respect to the one principal surface, the second substrate is disposed within the element substrate. The first bonding member is provided between the peripheral region and the second substrate. The second bonding member is provided between the effective pixel region and the second substrate. In a planar view with respect to the one principal surface, at least a part of an end portion of the second substrate is positioned on the first bonding member.

20 Claims, 10 Drawing Sheets

(56) References Cited

FOREIGN PATENT DOCUMENTS

| JP | 2008-277063 A | 11/2008 |
| JP | 2011-086578 A | 4/2011 |
| JP | 2018-200833 A | 12/2018 |
| JP | 2019-080044 A | 5/2019 |

\* cited by examiner

SEMICONDUCTOR APPARATUS HAVING FIRST AND SECOND BONDING MEMBERS, DISPLAY APPARATUS, PHOTOELECTRIC CONVERSION APPARATUS, ELECTRONIC DEVICE, ILLUMINATION APPARATUS, AND MOVING BODY

This application is a Continuation of U.S. patent application Ser. No. 16/997,259, filed Aug. 19, 2020 which claims the benefit of Japanese Patent Application No. 2019-158969, filed Aug. 30, 2019, each of which are hereby incorporated by reference herein in its entirety.

BACKGROUND

Technical Field

The present disclosure relates to a semiconductor apparatus, a display apparatus, a photoelectric conversion apparatus, an electronic device, an illumination apparatus, and a moving body.

Description of the Related Art

In a semiconductor apparatus configured to perform image capturing or display, an opposing substrate that is opposing an element substrate is provided for protecting the element substrate. The opposing substrate is bonded to the element substrate by a bonding member. The bonding member is provided in a peripheral region outside an effective pixel region. Further, a translucent resin material is provided to fill a space formed with the opposing substrate on the effective pixel region. Thus, interfacial reflection between the opposing substrate and air can be reduced.

Japanese Patent Application Laid-Open No. 2013-206613 discusses a display apparatus in which an element substrate and a sealing substrate are bonded by a bonding layer and a reinforcing seal layer. The bonding layer is provided on an effective pixel region, and the reinforcing seal layer is provided in a peripheral region.

In Japanese Patent Application Laid-Open No. 2013-206613, the sealing substrate is, in a planar view, smaller in size than the element substrate, and a part of the peripheral region that is other than an external connection terminal portion of the element substrate is exposed.

In the peripheral region, however, there may be provided an element or a circuit, such as a peripheral circuit, an ineffective pixel, and a conductive line. Further, an insulating layer configured to block moisture flowing to an effective pixel region may extend from the effective pixel region to the peripheral region. Consequently, if external force is applied to the exposed peripheral region, there may be a possibility that the peripheral circuit or the conductive line becomes damaged, or the insulating layer configured to block moisture becomes damaged, and thus reliability of a semiconductor apparatus declines.

SUMMARY

According to an aspect of the embodiments, a semiconductor apparatus includes an element substrate including an effective pixel region having a plurality of effective pixels on one principal surface side of a first substrate, and a peripheral region positioned around the effective pixel region, a second substrate, and a first bonding member and a second bonding member configured to bond the element substrate and the second substrate. The second bonding member includes a material different from that of the first bonding member. In a planar view with respect to the one principal surface, the second substrate is disposed within the element substrate. The first bonding member is provided between the peripheral region and the second substrate. The second bonding member is provided between the effective pixel region and the second substrate. In a planar view with respect to the one principal surface, at least a part of an end portion of the second substrate is positioned on the first bonding member.

Further features of the disclosure will become apparent from the following description of exemplary embodiments with reference to the attached drawings.

DESCRIPTION OF THE EMBODIMENTS

Figure 1A:
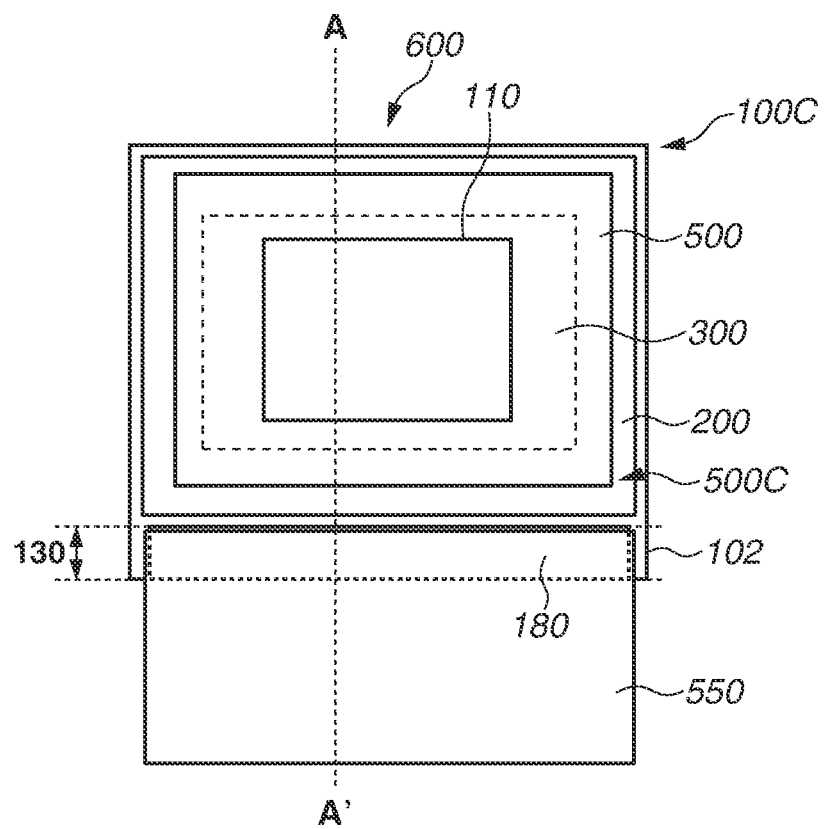
FIGS. 1A and 1B are schematic diagrams illustrating a semiconductor apparatus according to a first exemplary embodiment.

Hereinafter, exemplary embodiments of the present disclosure will be described with reference to the drawings. In the following description and drawings, configurations common to a plurality of drawings are assigned common reference numerals. Thus, the common configurations will be described with reference to the plurality of drawings, and the description of the configurations assigned common reference numerals will be appropriately omitted.

According to an exemplary embodiment of the present disclosure, it is possible to prevent an element, such as a peripheral circuit, an ineffective pixel, or a conductive line, provided in a peripheral region of a semiconductor apparatus from being damaged by external force. It is also possible to prevent an insulating layer for blocking moisture from being damaged by external force in a peripheral region. A semiconductor apparatus with enhanced reliability can thereby be provided.

Figure 1B:
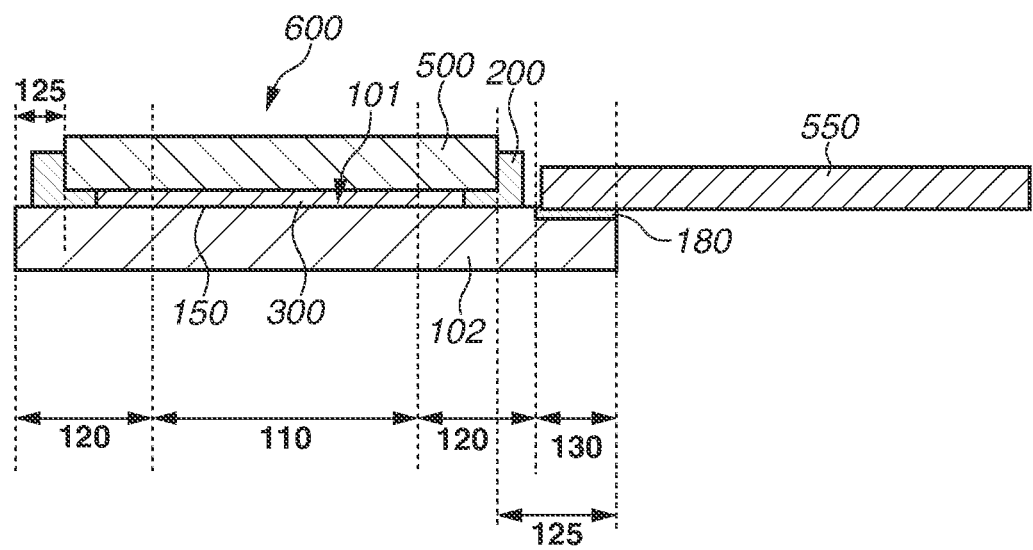

FIG. 1A illustrates a plan view of a semiconductor apparatus 600 according to a first exemplary embodiment that is planarly viewed with respect to a principal surface of an element substrate 102. FIG. 1B is a cross-sectional view of the semiconductor apparatus 600 taken along a broken line AA' marked in FIG. 1A. Hereinafter, in describing the present disclosure with reference to plan views, an inside refers to a center side of a semiconductor substrate or an opposing substrate, and an outside refers to an end portion side of the semiconductor substrate or the opposing substrate.

The semiconductor apparatus 600 includes the element substrate 102 (illustrated in FIG. 2B), an opposing substrate 500, a first bonding member 200, and a second bonding member 300. The semiconductor apparatus 600 further includes an external connection terminal 180.

The element substrate 102 includes an effective pixel region 110 on the side of one principal surface 101 of the substrate 100, and a peripheral region 120 positioned around the effective pixel region 110. FIG. 1A illustrates an example in which the element substrate 102 further includes a terminal region 130 in which the external connection terminal 180 is provided, and the peripheral region 120 is a region being positioned around the effective pixel region 110 and excluding the terminal region 130.

A peripheral circuit and a conductive line are provided in the peripheral region 120. In a case where the semiconductor apparatus 600 is a display apparatus, the peripheral circuit includes a drive circuit for driving an effective pixel, and a processing circuit, such as a digital-analog conversion (DAC) circuit configured to process a signal input to an effective pixel. In a case where the semiconductor apparatus 600 is a photoelectric conversion apparatus, the peripheral circuit includes a drive circuit for driving an effective pixel, and a processing circuit, such as an analog-digital conversion (ADC) circuit configured to processes a signal output from an effective pixel. The peripheral region 120 can include an ineffective pixel, such as a dummy pixel, a reference pixel, a test pixel, and a monitor pixel each of which does not function as an effective pixel.

As illustrated in FIG. 1A, the opposing substrate 500 is provided to oppose the effective pixel region 110 of the element substrate 102, but does not oppose a part of the peripheral region 120 and the terminal region 130 of the element substrate 102. In other words, the opposing substrate 500 is disposed within or inside the element substrate 102, such as the element substrate 102 is covered and/or overlapped (without contact) with the opposing substrate 500, and the opposing substrate 500 is surrounded and/or encompassed by a side surface (outer edge) of the element substrate 102 and/or the substrate 100, in a planar view with respect to the principal surface of the element substrate 102.

In the above description, a state in which a member A and a member B oppose each other refers to a state in which one surface of the member A and one surface of the member B face each other, and a half or more of a surface with a smaller area of the facing surfaces overlaps the other surface in orthogonal projection with respect to the surfaces. In contrast, a state in which the member B opposes one principal surface of the member A refers to a state in which, in a planar view with respect to the one principal surface of the member A, the one principal surface of the member A and the member B face each other and a half or more of the member B overlaps the one principal surface in orthogonal projection with respect to the one principal surface. In addition, a member or a component other than the member A and the member B may be provided between the facing surfaces.

In the above-described element substrate 102, a region not opposing the opposing substrate 500 will be referred to as an unopposing region 125. More specifically, the unopposing region 125 refers to a region of the element substrate 102 that does not overlap the opposing substrate 500 in a planar view with respect to the one principal surface of the element substrate 102.

The first bonding member 200 is provided in the peripheral region 120, and disposed between the peripheral region 120 and the opposing substrate 500. As illustrated in FIGS. 1A and 1B, the first bonding member 200 extends from the inside of an end portion of the opposing substrate 500 to the outside thereof, and the first bonding member 200 is provided to cover at least a part of the unopposing region 125 of the element substrate 102. Thus, at least a part of an end portion of the first bonding member 200 is positioned on the unopposing region 125.

With such a configuration, at least the part of the unopposing region 125 is covered by the first bonding member 200, and thus it is possible to prevent a circuit or an element provided on the element substrate 102 from being damaged in the unopposing region 125. Further, it is possible to prevent an insulating layer 90 provided on the element substrate 102 for blocking moisture from being damaged by external force in the unopposing region 125. Thus, the reliability of the semiconductor apparatus 600 can be enhanced.

The second bonding member 300 is provided at least on the effective pixel region 110, and disposed between the effective pixel region 110 and the opposing substrate 500. In this example, the second bonding member 300 is also provided in a region between a region provided on the effective pixel region 110 and the first bonding member 200, on the peripheral region 120. The second bonding member 300 and the first bonding member 200 may be separated from each other, but it is desirable that an outer edge portion of the second bonding member 300 is in contact with an inner edge portion of the first bonding member 200.

A circuit substrate 550 (illustrated in FIG. 1B) is bonded to the external connection terminal 180 for supplying power to the substrate 100 from an external power source (not illustrated).

Next, a manufacturing method of a semiconductor apparatus according to an exemplary embodiment of the present disclosure will be described in detail with reference to FIGS. 2A to 2F. As an example of the effective pixel region 110 having a polygonal shape, FIGS. 2A to 2F illustrate an example in which the effective pixel region 110 is a quadrangle, and a diagonal length of the effective pixel region 110 is 5 to 50 mm.

Figure 2A:
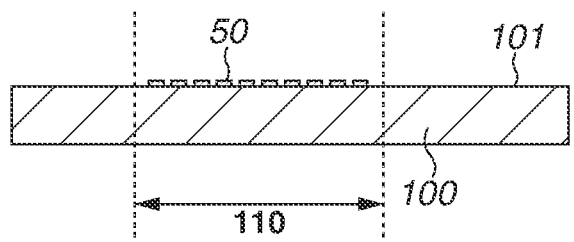
FIGS. 2A, 2B, 2C, 2D, 2E, and 2F are schematic diagrams illustrating a manufacturing method of the semiconductor apparatus according to the first exemplary embodiment.

As illustrated in FIG. 2A, semiconductor devices 50 are formed on the one principal surface 101 of the substrate 100, in the effective pixel region 110. The semiconductor devices 50 are transistors or diodes, and at least part of the semiconductor devices 50 are provided in the substrate 100. For example, a silicon substrate can be used for the substrate 100.

Figure 2B:
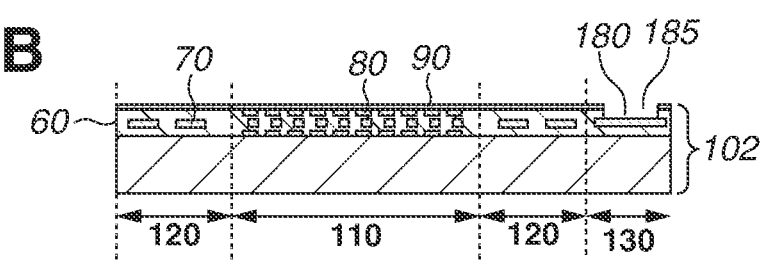

In a case where the semiconductor apparatus 600 is a display apparatus, an insulating layer 60 is formed on the semiconductor devices 50, and a wiring layer 70 and a functional element 80 as a display element are formed inside the insulating layer 60, as illustrated in FIG. 2B. Especially in a case where the display apparatus is an organic electroluminescence (EL) display apparatus, the insulating layer 90 for preventing water immersion is formed on the functional element 80.

For efficiently preventing entry of moisture to the functional element 80 from the outside, the insulating layer 90 is provided also in the peripheral region 120 in addition to the effective pixel region 110. FIG. 2B illustrates an example in which the insulating layer 90 is provided also on the outside of the opposing substrate 500 in a planar view with respect to the one principal surface of the substrate 100. As long as entry of moisture to the functional element 80 in the effective pixel region 110 can be blocked, the insulating layer 90 may be disposed only on the inside of the opposing substrate 500 in a planar view with respect to one principal surface of the substrate 100.

In a case where the semiconductor apparatus 600 is a photoelectric conversion apparatus, the insulating layer 60 and the wiring layer 70 are formed, after the semiconductor device 50 and the functional element 80 as a photoelectric conversion element are formed. The structures of the semiconductor device 50, the wiring layer 70, and the functional element 80 vary depending on a type of the semiconductor apparatus 600.

The wiring layer 70 may be a multilayer wiring layer. The wiring layer 70 may be an aluminum layer, a copper layer, or an alloy layer of these metals. The samples of the wiring layer 70 include a via plug and a contact plug. The wiring layer 70 is provided also in the peripheral region 120 in addition to the effective pixel region 110, and is electrically connected to a peripheral circuit.

The insulating layer 60 may be a silicon oxide layer, a silicon nitride layer, a silicon carbide layer, or a stacked layer of these layers. Silicon oxynitride and silicon carbonitride contain nitrogen and silicon as main elements. Thus, these materials are regarded as types of silicon nitride.

In a case where the semiconductor apparatus 600 is a display apparatus, the functional element 80 is a display element. Examples of the display element include an EL element used in an electroluminescence display (ELD), a liquid crystal element used in a liquid crystal display (LCD), and a reflective element used in a digital mirror device (DMD). If the semiconductor apparatus 600 is a photoelectric conversion apparatus, examples of the functional element 80 include a photoelectric conversion element. The external connection terminal 180 is provided in the terminal region 130, and an opening portion 185 for exposing the external connection terminal 180 is provided in the insulating layer 60 and the insulating layer 90 on the external connection terminal 180.

The insulating layer 60 and the insulating layer 90 may be a single layer of, for example, a silicon oxide, a silicon nitride, and a silicon carbide, or a stacked layer of these single layers. The opening portion 185 can be formed by using reactive ion etching to remove an insulating film formed on the external connection terminal 180 that is to become the insulating layer 60.

As the wiring layer 70 and the external connection terminal 180, a metal material such as aluminum or copper may be used. For preventing metal from dispersing in the substrate 100, barrier metal, such as titanium, tantalum, and nitride of these metals, may be used. In a case where aluminum is used for the wiring layer 70 and the external connection terminal 180, an aluminum film is formed over the entire surface by sputtering, and thereafter, a resist pattern is formed, and pattern processing is performed by reactive ion etching (RIE) using chlorine gas.

In a case where copper is used for the wiring layer 70, a so-called dual damascene method can be used. This method forms a trench in an insulating film and fills the trench with copper. The wiring layer 70 and the external connection terminal 180 may be formed with the same material, or may be formed in the same process.

Through the above-described processes, the element substrate 102 is formed. The element substrate 102 thereby includes the substrate 100, the semiconductor devices 50, the insulating layer 60, and the wiring layer 70. In a case where the semiconductor apparatus 600 is an organic EL display apparatus, the element substrate 102 further includes the insulating layer 90.

Figure 2C:
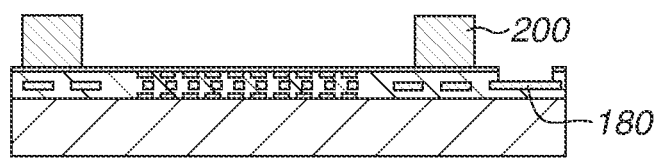

As illustrated in FIG. 2C, the first bonding member 200 is provided on the peripheral region 120 of the element substrate 102. The first bonding member 200 is a resin material, and is applied and formed using a method, such as a dispensing method, a screen printing method, and a flexographic printing method. The first bonding member 200 also functions as a bank during time for forming the second bonding member 300 described below. Thus, a viscosity of an application liquid of the first bonding member 200 is desirably 10 Pa·s or more, and more desirably 30 Pa·s or more.

Material examples of the first bonding member 200 include an acrylic resin, an epoxy resin, and a urethane resin. Any type of ultraviolet (UV) curable resin, thermoset resin, and two-component curable resin can be used. For example, in an organic EL element substrate, it is desirable to use UV curable resin because low-temperature curing can be achieved in a short time. Nevertheless, the resin is not cured yet in this process, and thus it is necessary to take care not to advance UV or thermal curing.

The first bonding member 200 desirably contains a spacer, such as a resin bead or a silica bead. By containing a spacer having a desired particle diameter, it is possible to easily control a gap between the substrate 100 and the opposing substrate 500. In a case where a particle diameter of the spacer is less than 1 µm, when a foreign substance of about 1 µm enters between the substrate 100 and the opposing substrate 500, the foreign substance may possibly be pushed into the functional element 80 or a peripheral circuit in the effective pixel region 110. In this case, there is concern that the functional element 80 or the peripheral circuit is damaged and malfunctions.

Because it is difficult to exclude a foreign substance of 1 µm or less in a manufacturing process and such an exclusion process leads to a decline in yield ratio, a particle diameter of the spacer is desirably 1 µm or more. In contrast, if a particle diameter of the spacer is 50 µm or more, when a semiconductor apparatus is subjected to a high-temperature environment or high-temperature and humidity environment, a void or a crack is easily generated in the second bonding member 300. This is because of a large degree of volume expansion caused by thermal expansion or water absorption of the second bonding member 300 filled in between the substrate 100 and the opposing substrate 500. Thus, a particle diameter of the spacer is desirably 1 to 50 µm, and more desirably, 3 to 30 µm.

Figure 2D:
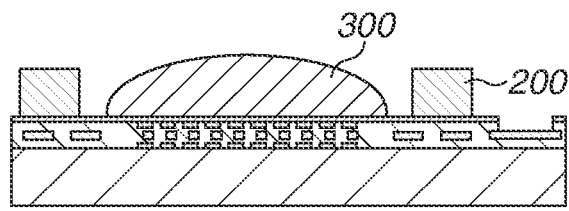

Subsequently, the second bonding member 300 is applied to a region separated by the first bonding member 200 placed on the one principal surface of the substrate 100 and including the effective pixel region 110, as illustrated in FIG. 2D. The second bonding member 300 is a resin material. An appropriate quantity of the second bonding member 300 is applied using the dispensing method. The appropriate quantity refers to a quantity at which the second bonding member 300 wetly spreads to the vicinity of an inner edge of the first bonding member 200, and the second bonding member 300 does not protrude to the outside of the first bonding member 200, in a bonding process of the opposing substrate 500 described below.

Since it is necessary to cause the second bonding member 300 to easily spread to the vicinity of the inner edge of the first bonding member 200 while suppressing the interfusion of air bubbles during the bonding process of the opposing substrate 500, a viscosity of application liquid of the second bonding member 300 is desirably lower than that of the application liquid of the first bonding member 200. The viscosity of the application liquid of the second bonding member 300 is desirably, for example, 1 Pa·s or less, and more desirably, 0.5 Pa·s or less.

In the functional element 80 that receives and emits light through the opposing substrate 500 like a solid-state image sensor or a display element, resin having high light permeability at least in a visible light range wavelength is desirably used as the second bonding member 300. Furthermore, a material having a small difference in refractive index from the opposing substrate 500 is desirably used as the second bonding member 300, thereby reducing reflection or refraction at an interface with the opposing substrate 500. Accordingly, in a case where glass (refractive index: 1.5) is used as the opposing substrate 500, a refractive index of the second bonding member 300 is desirably 1.4 to 1.6, and more desirably 1.45 to 1.55.

Figure 2E:
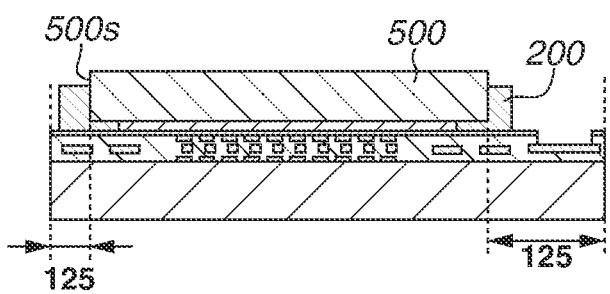

Subsequently, as illustrated in FIG. 2E, the opposing substrate 500 is bonded to opposite the one principal surface of the substrate 100.

In a case where the semiconductor apparatus 600 is a display apparatus or a photoelectric conversion apparatus, a material having high light permeability, such as glass, can be desirably used as the opposing substrate 500. An antireflection film may be additionally formed on a principal surface on the opposite side to the interface with the second bonding member 300 among principal surfaces of the opposing substrate 500.

The opposing substrate 500 is only required to be disposed at least on the effective pixel region 110 of the element substrate 102, and an end portion of the opposing substrate 500 is positioned on the peripheral region 120 of the element substrate 102. Thus, the opposing substrate 500 covers the effective pixel region 110 of the element substrate 102 and a part of the peripheral region 120, and the element substrate 102 includes the unopposing region 125 not opposing the opposing substrate 500.

In this manner, by reducing the size of the opposing substrate 500 to a size smaller than the substrate 100, a member cost can be reduced. The first bonding member 200 extends on the element substrate 102 from the inside of the end portion of the opposing substrate 500 to the outside thereof. That is to say, the first bonding member 200 extends on the element substrate 102 up to the unopposing region 125. In other words, in a planar view with respect to one principal surface of the substrate 100, at least a part of the end portion of the opposing substrate 500 is positioned on the first bonding member 200.

Because there is a portion covering the first bonding member 200 in the unopposing region 125 excluding the terminal region 130, at least a part of the peripheral region 120 is protected. Thus, in a case where an element or a circuit, such as an ineffective pixel, a peripheral circuit, and a conductive line, is disposed in the unopposing region 125 of the peripheral region 120, it is possible to prevent the element or circuit from being damaged by external force. In addition, in a case where the insulating layer 90 for blocking moisture extends to the outside the opposing substrate 500 in a planar view with respect to the substrate 100, it is possible to prevent the insulating layer 90 from being damaged. Thus, the reliability and durability of the semiconductor apparatus 600 can be improved.

From an aspect of preventing damage of the peripheral region 120, it is desirable that the first bonding member 200 is provided to cover a wide region of the unopposing region 125. The first bonding member 200 is desirably provided to cover an area of at least ⅓ or more of an area of the unopposing region 125, and more desirably provided to cover an area of ½ or more of the area of the unopposing region 125. More specifically, the first bonding member 200 is desirably disposed over a region having an area of ⅓ or more of an area of a region of the element substrate 102 that does not overlap the opposing substrate 500 in a planar view with respect to one principal surface of the substrate 100. The first bonding member 200 is more desirably disposed over a region having an area of ½ or more of the region.

In a case where the terminal region 130 is disposed on the opposing substrate 500 side of the element substrate 102, the first bonding member 200 is desirably provided to cover an area having at least ⅓ or more of an area of a region of the unopposing region 125, the region excluding an area of the terminal region 130. The first bonding member 200 is more desirably provided to cover an area of ½ or more thereof. More specifically, the first bonding member 200 is desirably disposed over a region having an area of ⅓ or more of an area of a region of the element substrate 102, the region not overlapping the opposing substrate 500 and excluding an area of the terminal region 130, in a planar view with respect to one principal surface of the substrate 100. Furthermore, the first bonding member 200 is more desirably provided over a region having an area of ½ or more of the area of the region.

In addition, in a case where a plurality of semiconductor apparatuses 600 is formed on one wafer and is lastly separated into individual semiconductors by scribing, the first bonding member 200 is desirably formed over the entire surface of the peripheral region 120 that excludes a scribe region (not illustrated) and the terminal region 130. This is because, if the first bonding member 200 is scribed together with the substrate 100, the first bonding member 200 clogs into a scribing wheel, and cleavage quality and operating life of the wheel decline.

In the present exemplary embodiment, the terminal region 130 is provided on the one principal surface side of the substrate 100. Alternatively, the external connection terminal 180 may be provided with a penetrating electrode penetrating from a second principal surface on the opposite side of the one principal surface of the substrate 100, and the circuit substrate 550 described below may be bonded to the second principal surface. In this case, the first bonding member 200 may be extended also on the external connection terminal 180 on the substrate 100. By providing the first bonding member 200 on the external connection terminal 180, it is possible to protect the external connection terminal 180 from damage.

In this process, by applying a fixed load to the opposing substrate 500, the second bonding member 300 provided between the opposing substrate 500 and the substrate 100 is pressed by the opposing substrate 500. Consequently, the second bonding member 300 is applied to be spread by being pressed in a direction of the first bonding member 200. An outer edge portion of the second bonding member 300 may be in contact with an inner edge portion of the first bonding member 200, or may be separated from the first bonding member 200. For controlling an interval between the substrate 100 and the opposing substrate 500, the first bonding member 200 desirably contains a spacer having a fixed particle diameter.

In this case, a bonding load is desirably set in such a manner that a gap between the substrate 100 and the opposing substrate 500 becomes subequal to the particle diameter of the spacer. If the bonding load is low, a variation in the gap between substrates becomes larger, and parallelism of the principal surface of the opposing substrate 500 with respect to the principal surface of the substrate 100 declines. This can possibly affect optical characteristics of a display element or a light receiving element. In contrast, if an excess bonding load is applied, the spacer is crushed and the gap becomes equal to or less than a spacer particle diameter, and a circuit or an element can possibly be damaged by the pressure occurring in the spacer.

As the first bonding member 200, a material with a high elasticity modulus is desirably used. Using a resin material with a high elasticity modulus enables preventing a circuit or an element provided in the peripheral region 120 from being damaged by an external force applied to the peripheral region 120. Specifically, it is desirable to set an elasticity modulus of the first bonding member 200 to 500 MPa or more, and it is more desirable to set the elasticity modulus to 1 GPa or more. In contrast, as the second bonding member 300, it is desirable to use a resin material with a lower elasticity modulus as compared with the first bonding member 200.

In a case where a load is applied from the surface side of the opposing substrate 500 in a state in which a hard foreign substance is mixed into the second bonding member 300, if an elasticity modulus of the second bonding member 300 is high, the functional element 80 might be damaged by the foreign substance together with the second bonding member 300. It is therefore desirable to set an elasticity modulus of the second bonding member 300 to 100 MPa or less, and it is more desirable to set the elasticity modulus to 10 MPa or less. In this manner, by setting a low elasticity modulus as an elasticity modulus of the second bonding member 300, even if a hard foreign substance is mixed into the second bonding member 300, the second bonding member 300 serves as a buffer material, and thereby preventing damage to the functional element 80.

The first bonding member 200 wraps around a side surface 500s of the opposing substrate 500, and the first bonding member 200 can accordingly cover a part or all of the side surface 500s of the opposing substrate 500. Thus, adhesive force applied between the opposing substrate 500 and the first bonding member 200 can be enhanced. Furthermore, in a case where a material having brittleness, such as glass, is used as the opposing substrate 500, a fraction of the opposing substrate 500 may fall from the side surface of the opposing substrate 500. This leads to an electrical connection failure (described below) in a process of bonding the circuit substrate 550 to the external connection terminal 180. In the semiconductor apparatus 600 according to the present exemplary embodiment, since the first bonding member 200 covers the side surface 500s of the opposing substrate 500, the above-described connection failure can be prevented and a yield ratio can be enhanced.

Figure 2F:
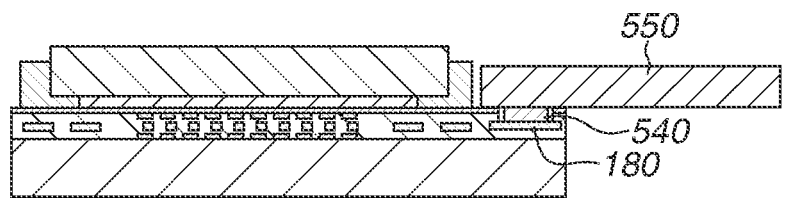

Subsequently, as illustrated in FIG. 2F, the external connection terminal 180 of the substrate 100 and the circuit substrate 550 are connected via a bonding member 540. As the circuit substrate 550, any of a rigid substrate and a flexible substrate can be used. In the rigid substrate, a wiring pattern is formed on a glass epoxy base material or a low temperature co-fired ceramics base material. In the flexible substrate, a wiring pattern is formed on a polyimide base material or a polyester base material. Since the flexible substrate can be freely bent, the flexible substrate is suitable for an electronic component used in a compact apparatus in which a large number of components are mounted.

As the bonding member 540, a metal material or a metal organic composite material can be used. Examples of the metal material include a solder bump (e.g., Sn—Ag), a gold bump, and a copper bump. Examples of the metal organic composite material include a conductive paste, and an anisotropic conductive film (ACF). In this case, a flexible substrate is used as the circuit substrate 550, and an ACF in which conductive particles are contained in epoxy resin is used as the bonding member 540. The circuit substrate 550 and the external connection terminal 180 are bonded by thermocompression bonding.

As described above, according to the present exemplary embodiment, the unopposing region 125 of the element substrate 102 can be protected with the first bonding member 200. Thus, in a case where an element or a circuit, such as an ineffective pixel, a peripheral circuit, and a conductive line, is disposed in the unopposing region 125 of the peripheral region 120, it is possible to prevent the element or circuit from being damaged by external force. Further, damage to the insulating layer 90 for blocking moisture can be prevented. Accordingly, the reliability and durability of the semiconductor apparatus 600 can be enhanced.

Figure 3A:
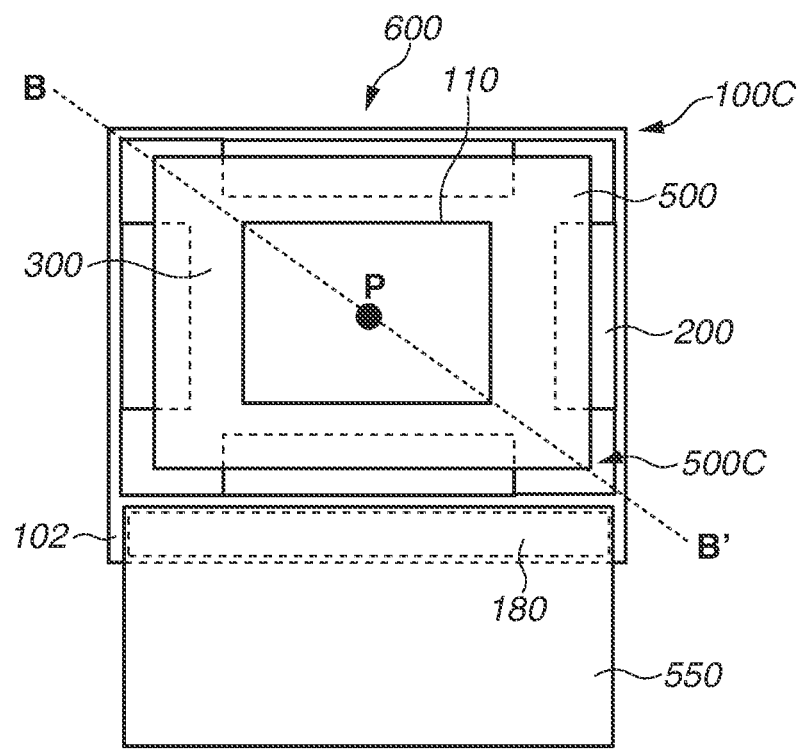
FIGS. 3A and 3B are schematic diagrams illustrating a semiconductor apparatus according to a second exemplary embodiment.
Figure 3B:
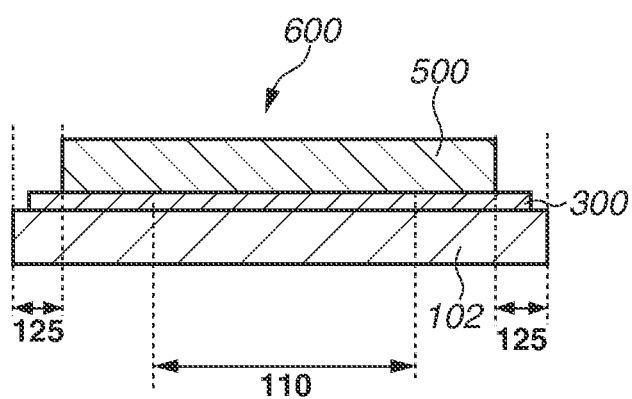

FIGS. 3A and 3B respectively illustrate a plan view and a cross-sectional view of the structure of a semiconductor apparatus 600 according to a second exemplary embodiment. These figures are similarly illustrated to the first exemplary embodiment (FIGS. 1A and 1B). FIGS. 3A and 3B illustrate an example in which the substrate 100 and the opposing substrate 500 have a polygonal shape. Specifically, the substrate 100 and the opposing substrate 500 are quadrangles.

FIG. 3A illustrates a plan view of the semiconductor apparatus 600 according to the second exemplary embodiment, which is planarly viewed with respect to the principal surface of the element substrate 102. FIG. 3B is a cross-sectional view of the semiconductor apparatus 600 taken along a broken line BB' marked in FIG. 3A. The present exemplary embodiment is different from the first exemplary embodiment in that, in a planar view with respect to the principal surface of the element substrate 102, the first bonding member 200 is separated at a corner portion 500C (FIG. 3A) of an outer edge portion of the opposing substrate 500.

More specifically, the first bonding member 200 includes at least two separated portions. The second bonding member 300 is disposed between the two separated portions of the first bonding member 200. Thus, in the vicinity of the corner portion 500C of the opposing substrate 500, the second bonding member 300 extends on the unopposing region 125 of the element substrate 102.

In a case where the substrate 100 and the opposing substrate 500 have a polygonal shape, the substrate 100 and the opposing substrate 500 each include corner portions, in a planar view with respect to one principal surface of the element substrate 102. In FIG. 3A, the element substrate 102 and the opposing substrate 500 are quadrangles, and each of the substrates include four corner portions 100C or 500C.

In the semiconductor apparatus 600 according to the present exemplary embodiment, the substrate 100 and the opposing substrate 500 are bonded each other by the first bonding member 200 and the second bonding member 300. In this case, if a temperature change occurs in the semiconductor apparatus 600, internal stress attributed to a difference in thermal expansion coefficient between the substrates is generated in the first bonding member 200 and the second bonding member 300. The internal stress generated in the first bonding member 200 and the second bonding member 300 becomes larger as a distance from a center P of the effective pixel region 110 becomes larger. Thus, internal stress becomes the largest at the corner portion 500C of the opposing substrate 500.

Further, internal stress is also generated near the interface between the bonding members due to a difference in thermal expansion coefficient, which is attributed to a difference in material or contained substance between the first bonding member 200 and the second bonding member 300. In a case where the first bonding member 200 is provided around the entire perimeter of the end portion of the opposing substrate 500 as described in the first exemplary embodiment, two types of internal stress generated at the interface between the bonding members become the maximum at the corner portions 500C of four sides of the opposing substrate 500. Thus, at the corner portion 500C of the opposing substrate 500, a crack can possibly occur in either the first bonding member 200 or the second bonding member 300.

In the present exemplary embodiment, the first bonding member 200 is separated at the corner portion 500C of the opposing substrate 500. In other words, the first bonding member 200 is not provided at the corner portion 500C of the opposing substrate 500, and only the second bonding member 300 is provided at the corner portion 500C of the opposing substrate 500. Thus, only internal stress attributed to a difference in thermal expansion coefficient between the substrates occurs in the second bonding member 300, and thereby reducing internal stress generated due to a difference in thermal expansion coefficient, the stress being attributed to a difference in material or contained substance between the first bonding member 200 and the second bonding member 300. It is therefore possible to reduce total internal stress at the corner portion 500C of the opposing substrate 500, and consequently prevent a crack generated in the second bonding member 300.

Since the first bonding member 200 is not provided at the corner portion 500C of the opposing substrate 500, the second bonding member 300 protrudes to the outside of the opposing substrate 500 and extends up to the unopposing region 125 at the corner portion 500C of the opposing substrate 500, as illustrated in the cross-sectional view in FIG. 3B. Thus, the unopposing region 125 of the substrate 100 is covered by the second bonding member 300 in the vicinity of the corner portion 500C of the opposing substrate 500. This can prevent a circuit or an element from being damaged by external force in the unopposing region 125. In a case where the semiconductor apparatus 600 is an organic EL display apparatus, damage to the insulating layer 90 for moisture block can be prevented. Thus, the reliability and durability of the semiconductor apparatus 600 is enhanced.

In the configuration of the present exemplary embodiment, the second bonding member 300 also serves as a protection material of the unopposing region 125 of the substrate 100. Thus, an elasticity modulus of the second bonding member 300 is desirably set to 100 MPa or more and 500 MPa or less.

From the aspect of preventing damage to the peripheral region 120, at least one of the first bonding member 200 or the second bonding member 300 is desirably provided to cover an area of at least ⅓ or more of an area of the unopposing region 125. At least one of the first bonding member 200 or the second bonding member 300 is more desirably provided to cover an area of at least ½ or more of an area of the unopposing region 125. More specifically, at least one of the first bonding member 200 or the second bonding member 300 is desirably provided over a region having an area of ⅓ or more of an area of a region of the element substrate 102, the region not overlapping the opposing substrate 500, in a planar view with respect to one principal surface of the element substrate 102. At least one of the first bonding member 200 or the second bonding member 300 is more desirably disposed over a region having an area of ½ or more of the area of the region.

In a case where the terminal region 130 is disposed on the opposing substrate 500 side of the element substrate 102, at least one of the first bonding member 200 or the second bonding member 300 is desirably provided to cover an area of at least ⅓ or more of an area of the unopposing region 125, the area excluding an area of the terminal region 130. At least one of the first bonding member 200 or the second bonding member 300 is more desirably provided to cover an area of ½ or more of the region. More specifically, at least one of the first bonding member 200 or the second bonding member 300 is desirably disposed over a region having an area of ⅓ or more of an area of a region of the element substrate 102 that does not overlap the opposing substrate 500 and excludes the terminal region 130, in a planar view with respect to one principal surface of the element substrate 102. Furthermore, at least one of the first bonding member 200 or the second bonding member 300 is more desirably disposed over a region having an area of ½ or more of the area of the region.

As described above, also in the present exemplary embodiment, it is possible to prevent a circuit, an element, or an insulating layer from being damaged by external force, by protecting the unopposing region 125 of the element substrate 102 with the first bonding member 200 and the second bonding member 300. Thus, reliability and durability of the semiconductor apparatus 600 are enhanced. It is also possible to prevent a crack of the second bonding member 300 at the corner portion 500C of the opposing substrate 500, the crack being attributed to a temperature change or moisture absorption. Thus, reliability of the semiconductor apparatus 600 is enhanced.

Figure 4A:
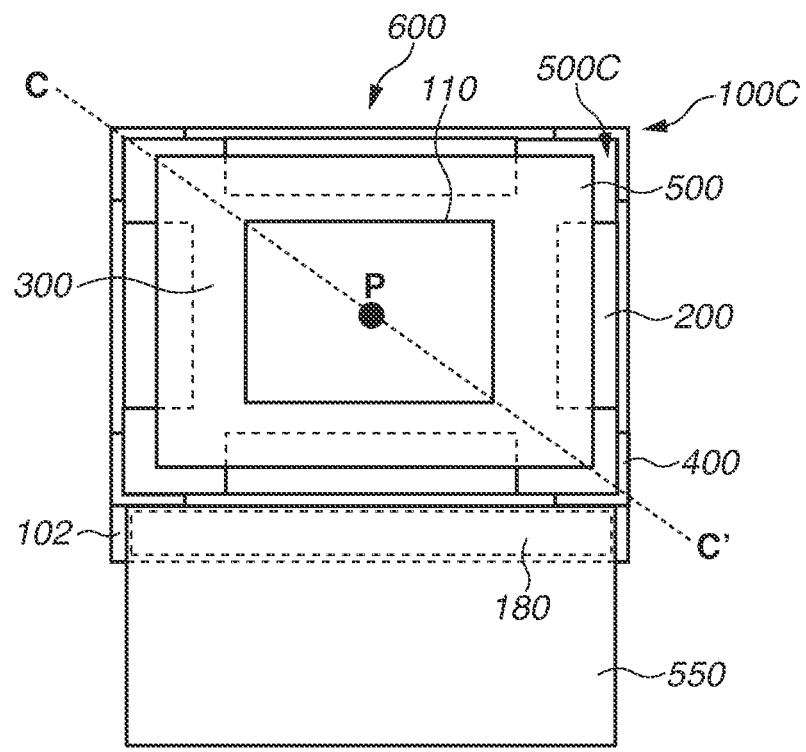
FIGS. 4A and 4B are schematic diagrams illustrating a semiconductor apparatus according to a third exemplary embodiment.
Figure 4B:
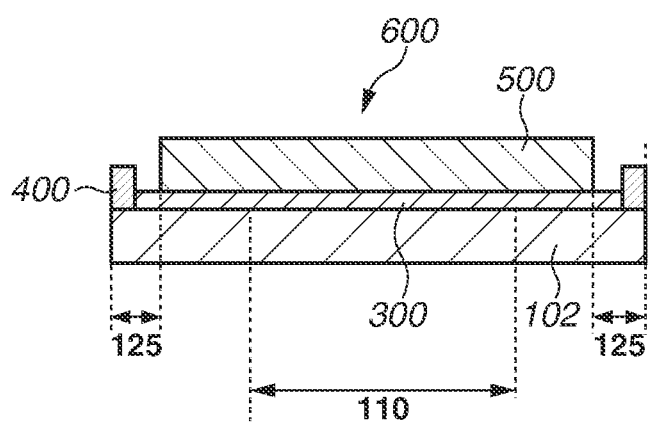

FIGS. 4A and 4B respectively illustrate a plan view and a cross-sectional view of the structure of a semiconductor apparatus 600 according to a third exemplary embodiment. These figures are similarly illustrated to the first exemplary embodiment (FIGS. 1A and 1B). FIG. 4A illustrates a plan view of the semiconductor apparatus 600 according to the present exemplary embodiment, which is planarly viewed with respect to one principal surface of the element substrate 102. FIG. 4B illustrates a cross-sectional view of the semiconductor apparatus 600 taken along a broken line CC' marked in FIG. 4A.

Also in the present exemplary embodiment, the first bonding member 200 is not provided in the vicinity of the corner portion 500C of the opposing substrate 500, similarly to the second exemplary embodiment. However, the present exemplary embodiment is different from the second exemplary embodiment in that a structural member 400 is provided on the unopposing region 125 of the element substrate 102. The structural member 400 has a function of preventing the second bonding member 300 from protruding to the outside over the end portion of the element substrate 102 when the opposing substrate 500 is bonded. Thus, a part of the structural member 400 and the second bonding member 300 are in contact with each other. On the other hand, the opposing substrate 500 is not disposed on the structural member 400.

Thus, internal stress attributed to a difference in thermal expansion coefficient between the substrates does not occur in the structural member 400 and the second bonding member 300, and it is accordingly possible to prevent a crack from occurring in the second bonding member 300 in the vicinity of the corner portion 500C of the opposing substrate 500, similarly to the second exemplary embodiment.

In a case where the first bonding member 200 is not provided at the corner portion 500C of the opposing substrate 500 as in the present exemplary embodiment, a protruding amount of the second bonding member 300 becomes the largest at the corner portion 500C of the opposing substrate 500. Thus, the structural member 400 is desirably provided in a region at least including an extended line of a straight line connecting the center P of the effective pixel region 110 and the corner portion 500C of the opposing substrate 500.

In FIGS. 4A and 4B, the structural member 400 and the first bonding member 200 are separated from each other. However, the structural member 400 and the first bonding member 200 may be provided in contact. The structural member 400 may be provided between the first bonding member 200 and an end portion of the element substrate 102.

The structural member 400 may also function as a protection material for an element or a circuit in the unopposing region 125 of the element substrate 102. It is therefore desirable to set an elasticity modulus of the structural member 400 to 500 MPa or more similarly to the first bonding member 200, and it is more desirable to set the elasticity modulus to 1 GPa or more.

The structural member 400 is only required to be formed at any timing between the formation of the first bonding member 200 (FIG. 2C) and the drop of the second bonding member 300 (FIG. 2D). The structural member 400 is required to be cured by any curing method after being applied by a method, such as dispensing, the screen printing method, and the flexographic printing method. After formation of the first bonding member 200, the screen printing method and the flexographic printing method cannot be used, and thus the dispensing method is used for forming the structural member 400. In contrast, in a case of forming the structural member 400 using the dispensing method or the screen printing method before the first bonding member 200 is formed, the first bonding member 200 is formed by the screen printing method or the flexographic printing method in lieu of the dispensing method.

Because the structural member 400 has a function of preventing the protrusion of the second bonding member 300, it is desirable to set the thickness of the structural member 400 to a thickness of at least double or more of the thickness of the second bonding member 300 (corresponding to a particle diameter of the spacer contained in the first bonding member 200), and it is more desirable to set the thickness to a thickness of quintuple or more. More specifically, if a particle diameter of the spacer contained in the first bonding member 200 is 10 μm, the thickness of the structural member 400 is desirably 20 μm or more, and more desirably, 50 μm or more.

For forming the structural member 400 having such a thickness by a method of application, the viscosity of the structural member 400 before being cured is desirably 10 Pa·s or more, and more desirably, 30 Pa·s or more. The structural member 400 can be formed using, for example, a resin material. Examples of the resin material include an acrylic resin, an epoxy resin, and a urethane resin. Any type of UV curable resin, thermoset resin, and two-component curable resin can also be used, but it is desirable to use UV curable resin because thermoset resin may make the thickness of the structural member 400 small by a reflow at a time of thermal curing.

The description has been given of an example in which a material different from the first bonding member 200 is used as the structural member 400, and the structural member 400 is formed in a different process. However, the same material may be used for the structural member 400 and the first bonding member 200. The structural member 400 and the first bonding member 200 may be formed in a same process. By forming the structural member 400 and the first bonding member 200 in the same process, a number of processes can be reduced.

From an aspect of preventing damage to the peripheral region 120, at least one of the first bonding member 200, the second bonding member 300, and the structural member 400 is desirably provided to cover an area of at least ⅓ or more of an area of the unopposing region 125. The area to be covered is more desirably provided to cover an area of at least ½ or more of an area of the unopposing region 125. More specifically, at least one of the first bonding member 200, the second bonding member 300, or the structural member 400 is desirably disposed over a region having an area of ⅓ or more of an area of a region of the element substrate 102, the region not overlapping the opposing substrate 500, in a planar view with respect to one principal surface of the element substrate 102. At least one of the first bonding member 200, the second bonding member 300, or the structural member 400 is more desirably disposed over a region having an area of ½ or more of the area of the region.

There may be a case where the terminal region 130 is disposed on the opposing substrate 500 side of the element substrate 102. In this case, at least one of the first bonding member 200, the second bonding member 300, and the structural member 400 is desirably provided to cover an area of at least ⅓ or more of an area of the unopposing region 125, the area excluding an area of the terminal region 130. The area to be covered is more desirably provided to cover an area of ½ or more of the area of the region.

More specifically, at least one of the first bonding member 200, the second bonding member 300, and the structural member 400 is desirably disposed over a region having an area of ⅓ or more of an area of a region of the element substrate 102, the region not overlapping the opposing substrate 500 and excluding an area of the terminal region 130, in a planar view with respect to one principal surface of the element substrate 102. Furthermore, at least one of the first bonding member 200, the second bonding member 300, or the structural member 400 is more desirably disposed over a region having an area of ½ or more of the area of the region.

As described above, also in the present exemplary embodiment, at least a part of the unopposing region 125 of the substrate 100 is covered and protected by the first bonding member 200, the second bonding member 300, and the structural member 400. It is therefore possible to prevent an element, a circuit, or an insulating layer from being damaged by external force, and thus the reliability and durability of the semiconductor apparatus 600 are enhanced.

Further, it is possible to prevent the occurrence of a crack in the second bonding member 300 at the corner portion 500C of the opposing substrate 500 that is attributed to a temperature change or moisture absorption. Thus, the reliability of the semiconductor apparatus 600 is enhanced. Furthermore, protrusion of the second bonding member 300 at the end portion of the substrate 100 can be prevented, and a process yield ratio can be high.

Figure 5A:
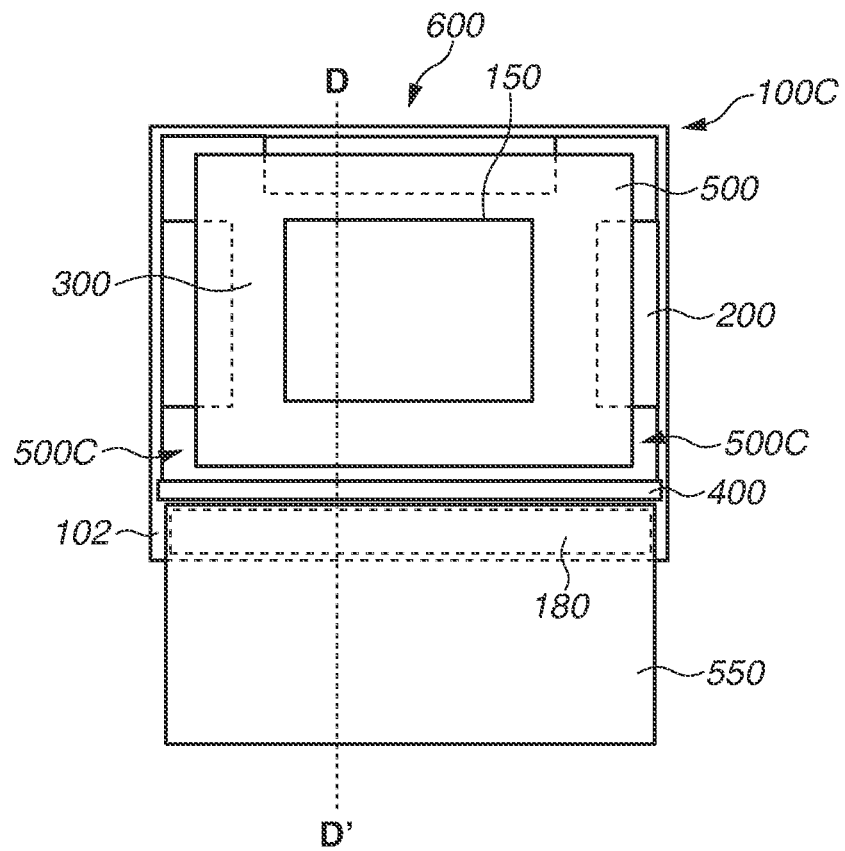
FIGS. 5A and 5B are schematic diagrams illustrating a semiconductor apparatus according to a fourth exemplary embodiment.
Figure 5B:
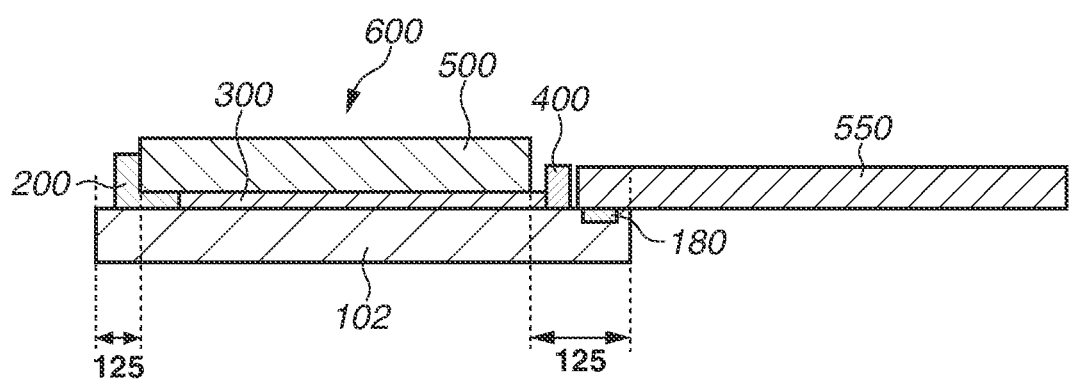

FIGS. 5A and 5B respectively illustrate a plan view and a cross-sectional view of the structure of a semiconductor apparatus 600 according to a fourth exemplary embodiment. These figures are similarly illustrated to the first exemplary embodiment (FIGS. 1A and 1B). FIG. 5A illustrates a plan view of the semiconductor apparatus 600 according to the present exemplary embodiment, which is planarly viewed with respect to the principal surface of the element substrate 102. FIG. 5B illustrates a cross-sectional view of the semiconductor apparatus 600 taken along a broken line DD' marked in FIG. 5A.

Also in the present exemplary embodiment, the first bonding member 200 is separated at the corner portion 500C of the opposing substrate 500, similarly to the second and third exemplary embodiments. The present exemplary embodiment is different from the third exemplary embodiment in that the structural member 400 is provided between the external connection terminal 180 and the end portion of the opposing substrate 500 in the unopposing region 125 of the substrate 100.

Similarly to the third exemplary embodiment, the structural member 400 is provided in the unopposing region 125 of the substrate 100. When the opposing substrate 500 is bonded to the substrate 100, there may be a case that the second bonding member 300 protrudes to the outside the opposing substrate 500. However, the second bonding member 300 can be prevented from adhering to the external connection terminal 180 by providing the structural member 400.

A part of the structural member 400 and the second bonding member 300 are in contact with each other, but the opposing substrate 500 is not disposed on the structural member 400. Thus, it is possible to reduce internal stress attributed to a difference in thermal expansion coefficient between the substrates that is generated in the structural member 400 and the second bonding member 300. This can prevent the occurrence of a crack in the second bonding member 300 in the vicinity of the corner portion 500C of the opposing substrate 500, even in a case where the structural member 400 is provided to traverse the element substrate 102 as illustrated in FIGS. 5A and 5B.

In the present exemplary embodiment, the first bonding member 200 is not provided between the effective pixel region 110 and the external connection terminal 180. However, the first bonding member 200 is provided on two sides or more of the opposing substrate 500, and thus a gap and parallelism between the substrates are appropriately maintained. On the other hand, it is possible to prevent the second bonding member 300 from reaching the external connection terminal 180, by arranging the structural member 400 between the end of the opposing substrate 500 and the external connection terminal 180. The first bonding member 200 is not provided on the external connection terminal side with respect to the effective pixel region 110, and thus space saving can be achieved.

A method and a material similar to those described in the third exemplary embodiment can be used as a formation method and a resin material for the structural member 400. The description has been given of an example in which a material different from the first bonding member 200 is used as the structural member 400, and the structural member 400 is formed in a different process. However, a same material may be used for the structural member 400 and the first bonding member 200. In addition, the structural member 400 and the first bonding member 200 may be formed in a same process. By forming the structural member 400 and the first bonding member 200 in the same process, it is possible to reduce a number of processes.

As described above, also in the present exemplary embodiment, the unopposing region 125 of the substrate 100 is covered and protected with the first bonding member 200, the second bonding member 300, and the structural member 400. It is therefore possible to prevent an element, a circuit, or an insulating layer from being damaged by external force, and thus the reliability and durability of the semiconductor apparatus 600 are enhanced.

It is also possible to prevent the occurrence of a crack in the second bonding member 300 at the corner portion 500C of the opposing substrate 500 that is attributed to a temperature change or moisture absorption. Thus, the reliability of the semiconductor apparatus 600 is enhanced. It is also possible to prevent the second bonding member 300 from protruding from the opposing substrate 500 and reaching the external connection terminal 180 in a planar view with respect to the substrate 100, and thereby enhance a process yield ratio.

In a fifth exemplary embodiment, a specific configuration example in a case where an organic EL element is used will be described as a specific example of the functional element 80 used in the first to fourth exemplary embodiments.

[Substrate]

Examples of materials of a substrate include quartz, glass, a silicon wafer, resin, and metal. On the substrate, a switching element such as a transistor and a conductive line may be provided, and an insulating layer may be provided on these elements. In the insulating layer, a contact hole can be formed for ensuring electrical connection between a positive electrode 2 and the conductive line. The material of the insulating layer is not limited as long as insulation from an unconnected conductive line is ensured. Examples of the material include resin such as polyimide, silicone oxide, and silicon nitride.

[Electrode]

Electrodes have a pair of electrodes. The pair of electrodes may have a positive electrode and a negative electrode. In a case of applying an electric field in a direction in which an organic light emitting element emits light, an electrode with a high potential serves as a positive electrode, and the other electrode serves as a negative electrode. It can also be said that an electrode for supplying a hole to a light emitting layer serves as a positive electrode, and an electrode for supplying an electron serves as a negative electrode.

As a constituent material of a positive electrode, a material having as large a work function as possible is suitable. Examples of the material include a single metal such as gold, platinum, silver, copper, nickel, palladium, cobalt, selenium, vanadium, and tungsten, a mixture containing these metals, and an alloy obtained by combining these metals. Examples of the material further include a metal oxide such as tin oxide, zinc oxide, indium oxide, indium tin oxide (ITO), or indium zinc oxide. Furthermore, a conductive polymer such as polyaniline, polypyrrole, and polythiophene can also be included.

One single type of these electrode materials may be used by itself, or two or more types may be used in combination. Further, a positive electrode may have a single layer, or a plurality of layers.

In a case of using an electrode as a repeller, metals such as chrome, aluminum, silver, titanium, tungsten, molybdenum, an alloy of these, and a stacked layer can be used. In a case of using an electrode as a transparent electrode, an oxide transparent conductive layer such as ITO or indium zinc oxide can be used. However, the material of the transparent electrode is not limited thereto. For forming the electrode, a photolithography technique can be used.

On the other hand, as a constituent material of a negative electrode, a material having a small work function is suitable. Examples of the material include an alkali metal such as lithium, an alkali earth metal such as calcium, a single metal such as aluminum, titanium, manganese, silver, lead, chrome, or a mixture containing these metals. Alternatively, an alloy obtained by combining these single metals can also be used. Examples of the alloy include magnesium-silver, aluminum-lithium, aluminum-magnesium, silver-copper, or zinc-silver. A metal oxide such as ITO can also be used.

One single type of these electrode materials may be used by itself, or two or more types may be used in combination. In addition, a negative electrode may have a single-layer configuration, or may have a multilayer configuration. Among these metals, it is desirable to use silver. It is further desirable to use a silver alloy for preventing aggregation of silver. A ratio of an alloy is not limited as long as aggregation of silver is prevented. The ratio may be 1:1.

A negative electrode may function as, for example, a top emission element by using an oxide conductive layer such as ITO, a bottom emission element by using a repeller such as aluminum (Al), and a semi-transmissive reflective electrode. The function of the negative electrode is not specifically limited. A formation method of the negative electrode is not specifically limited, however, it is desirable to use direct current and alternating current sputtering methods for better coverage of a film and for decreasing resistance.

[Sealing Layer or Protection Layer]

A sealing layer or a protection layer may be provided on the negative electrode. For example, sticking glass provided with a moisture absorbent onto the negative electrode can prevent water entry into an organic compound layer and occurrence of a display failure accordingly. As another exemplary embodiment, a passivation film containing silicon nitride or the like may be provided on the negative electrode. This prevents water entry into an organic EL layer. As the passivation film, the insulating layer 90 described in the first exemplary embodiment can be used.

Further, a protection layer may be formed by, for example, conveying the negative electrode to another chamber without breaking a vacuum state after the negative electrode is formed, and forming a silicon nitride film of a thickness of 2 μm using a chemical vapor deposition (CVD) method. For the protection layer, an atomic layer deposition (ALD) method may be used after forming the film by the CVD method.

[Color Filter]

On the protection layer, a color filter may be provided. For example, a color filter may be provided on another substrate considering the size of an organic light emitting element, and the substrate provided with the color filter and a substrate provided with the organic light emitting element may be bonded each other. Alternatively, a color filter may be patterned onto the above-described protection layer using the photolithography technique.

[Adhering Layer or Planarizing Layer]

Between the color filter and the protection layer, an adhering layer or a planarizing layer may be included. The adhering layer or the planarizing layer may include an organic compound. The organic compound may be a low molecule or a high molecule, but desirably a high molecule.

Planarizing layers may be provided above and/or below the color filter, and constituent materials of the planarizing layers may be the same or different. Specifically, examples of the material include polyvinyl carbazole resin, polycarbonate resin, polyester resin, acrylonitrile butadiene styrene (ABS) resin, acrylic resin, polyimide resin, phenol resin, epoxy resin, silicon resin, and urea resin.

[Opposing Substrate]

On the planarizing layer, an opposing substrate may be provided. Since the opposing substrate is provided at a place corresponding to the above-described substrate, the opposing substrate is referred to as an opposing substrate. A constituent material of the opposing substrate may be the same as that of the above-described substrate.

[Organic Layer]

An organic layer (e.g., hole implantation layer, hole transport layer, electron inhibition layer, light emitting layer, hole inhibition layer, electron transport layer, and electron implantation layer) included in a light emitting element according to the present exemplary embodiment is formed using the following method.

The organic layer can be formed using a dry process, such as a vacuum deposition method, an ionized deposition method, sputtering, and plasma. In place of the dry process, a wet process can also be used; the wet process forms a layer by dissolving into an appropriate solvent and using a known application method, such as spin coating, dipping, a cast method, a Langmuir-Blodgett (LB) method, and an inkjet method.

If a layer is formed using the vacuum deposition method or a solvent application method, crystallization is less likely to be generated, and good temporal stability can be obtained. In a case where a layer is formed using an application method, the layer can also be formed using appropriate binder resin in combination.

Examples of the above-described binder resin include polyvinyl carbazole resin, polycarbonate resin, polyester resin, ABS resin, acrylic resin, polyimide resin, phenol resin, epoxy resin, silicon resin, and urea resin. The above-described resins are examples, and the binder resin is not limited to these resins.

One single type of these binder resins may be used by itself as a homopolymer or a copolymer, or two or more types may be mixed. Furthermore, an additive agent, such as a known plasticizer, an antioxidant, and an ultraviolet absorber, may be used in combination as necessary.

In a sixth exemplary embodiment, the application of the semiconductor apparatus 600 will be described with reference to FIGS. 6 to 10. The semiconductor apparatus 600 described in the first exemplary embodiment can be used as a component of a display apparatus, a display unit, or an illumination apparatus. Aside from these apparatuses, the semiconductor apparatus 600 can be applied to an exposure light source of an electrophotographic image forming apparatus, a backlight of a liquid crystal display apparatus, or a light emitting apparatus having a white light source with a color filter.

A display apparatus may be an image information processing apparatus having an image input unit and an information processing unit, and displaying an input image on a display unit. The image input unit is configured to input image information obtained from an area charge-coupled device (CCD) image sensor, a linear CCD image sensor, or a memory card. The information processing unit is configured to process the input information.

A display unit included in an imaging apparatus or an inkjet printer may have a touch panel function. The touch panel function may take any type of the following driving methods and the function is not limited thereto; an infrared type, a capacitive type, a resistive type, and an electromagnetic induction type. The display apparatus may be provided in a display unit of a multifunctional printer.

Figure 6:
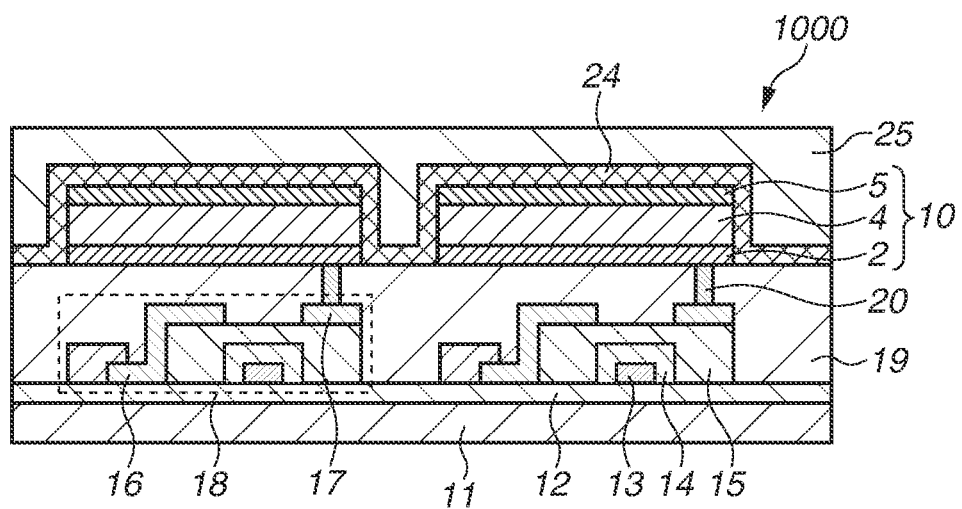
FIG. 6 is a schematic cross-sectional view illustrating an example of a display apparatus using a semiconductor apparatus according to a sixth exemplary embodiment.

Next, a display apparatus according to the present exemplary embodiment will be described with reference to the drawings. FIG. 6 is schematic cross-sectional view illustrating an example of a display apparatus including a light emitting element 10 being the functional element 80, and a thin-film transistor (TFT) element connected to the light emitting element 10. The TFT element is an example of the semiconductor device 50.

A display apparatus 1000 illustrated in FIG. 6 includes a substrate 11 such as glass, and a dampproof film 12 provided on the substrate 11 for protecting the TFT element or an organic layer 4. The display apparatus 1000 further includes a gate electrode 13 of metal, a gate insulating film 14, and a semiconductor layer 15.

A TFT element 18 includes the semiconductor layer 15, a drain electrode 16, and a source electrode 17. An insulating layer 19 is provided above the TFT element 18. A lower electrode 2 (positive electrode) included in the light emitting element 10 and the source electrode 17 are connected via a contact hole 20.

A method for electrically connecting an electrode (positive electrode, negative electrode) included in the light emitting element 10 and an electrode (source electrode, drain electrode) included in a TFT element is not limited to the method illustrated in FIG. 6. In other words, it is only required that either one of a positive electrode and a negative electrode and either one of a source electrode and a drain electrode of a TFT element are electrically connected.

In the display apparatus 1000 illustrated in FIG. 6, the organic layer 4 has one layer. However, the organic layer 4 may have a plurality of layers. A first protection layer 24 and a second protection layer 25 for suppressing deterioration of a light emitting element are provided on an upper electrode 5 (negative electrode).

The display apparatus 1000 illustrated in FIG. 6 uses a transistor as a switching element. Alternatively, a metal injection molding (MIM) element may be used as a switching element.

Further, a transistor used in the display apparatus 1000 illustrated in FIG. 6 is not limited to a transistor having a monocrystal silicon wafer. The transistor may be a thin-film transistor having an active layer on an insulating surface of a substrate. Examples of the active layer include non-monocrystal silicon (e.g., monocrystal silicon, amorphous silicon, and microcrystal silicon), and non-monocrystal oxide semiconductor (e.g., indium zinc oxide, and indium gallium oxide). The thin-film transistor is also referred to as a TFT element.

A transistor included in the display apparatus 1000 illustrated in FIG. 6 may be formed in a substrate such as a Si substrate. A transistor being formed in a substrate means that a transistor is manufactured by processing a substrate such as a Si substrate. In other words, a transistor included in a substrate can also be regarded as a transistor integrally formed with a substrate.

The light emission brightness of the light emitting element 10 according to the present exemplary embodiment is controlled by a TFT serving as an example of a switching element. By providing a plurality of the light emitting elements in a surface, an image can be displayed at each light emission brightness. The switching element according to the present exemplary embodiment is not limited to a TFT. The switching element may be a transistor formed of low-temperature polysilicon, or an active matrix driver formed on a substrate such as a Si substrate. Being formed on a substrate can also be referred to as being formed in the substrate. Whether to provide a transistor in a substrate or to use a TFT can be selected depending on the size of a display unit. For example, if the size of a display unit is about 0.5 inches, it is desirable that an organic light emitting element is provided on a Si substrate.

Figure 7:
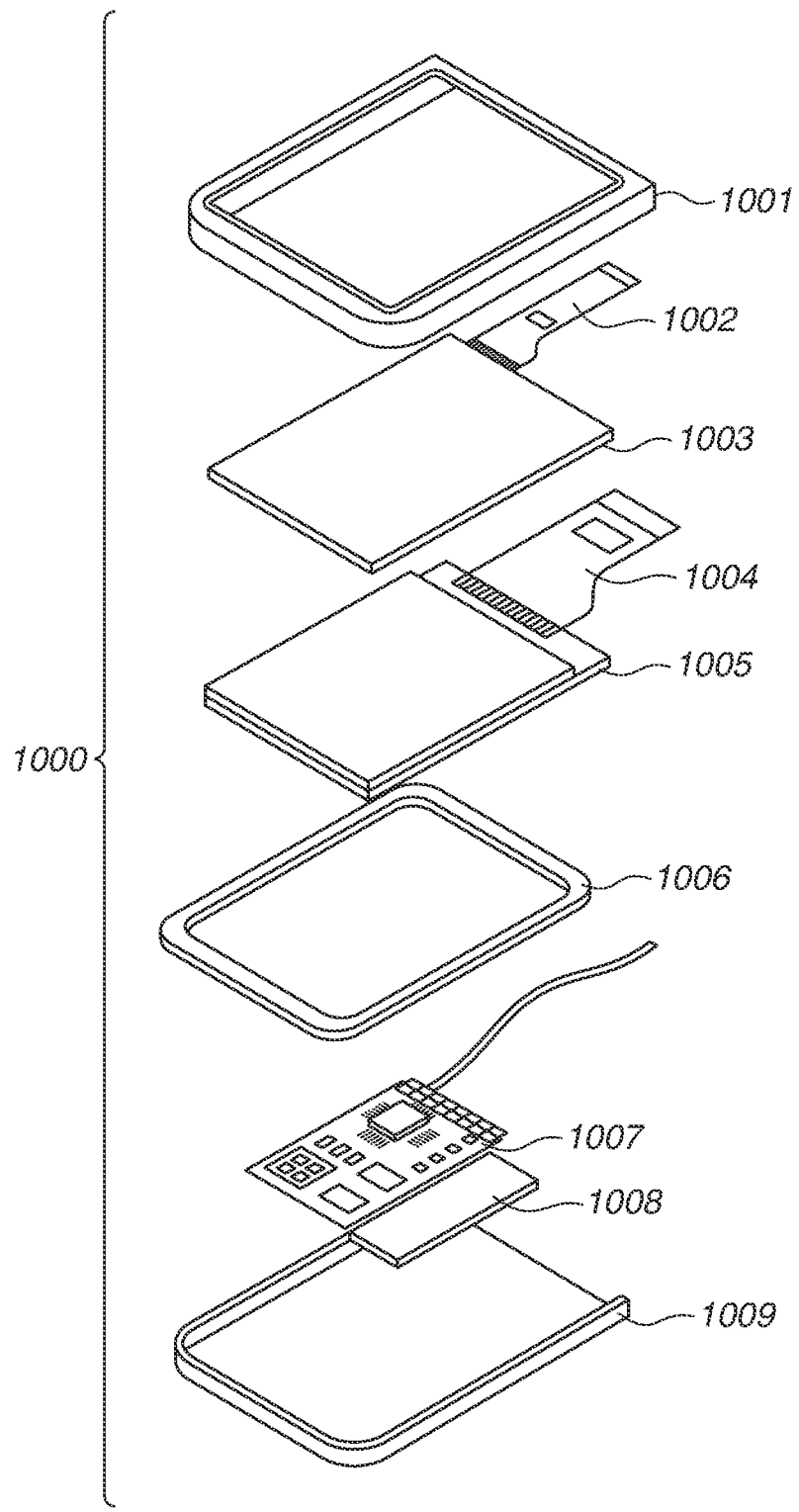
FIG. 7 is a schematic diagram illustrating an example of a display apparatus according to the sixth exemplary embodiment.

FIG. 7 is a schematic diagram illustrating an example of the display apparatus 1000 according to the present exemplary embodiment. The display apparatus 1000 may include a touch panel 1003, a display panel 1005, a frame 1006, a circuit substrate 1007, and a battery 1008 between an upper cover 1001 and a lower cover 1009. As the display panel 1005, for example, the semiconductor apparatus 600 described in the first exemplary embodiment can be used.

Flexible printed circuits (FPCs) 1002 and 1004 are connected to the touch panel 1003 and the display panel 1005, respectively. A transistor is printed on the circuit substrate 1007. The battery 1008 needs not be provided if the display apparatus 1000 is not a portable device. Even if the display apparatus 1000 is a portable device, the battery 1008 may be provided at another position.

The display apparatus 1000 according to the present exemplary embodiment may be used as a display unit of a photoelectric conversion apparatus; the photoelectric conversion apparatus includes an optical unit having a plurality of lenses, and an image sensor configured to receive light having passed through the optical unit. The photoelectric conversion apparatus may include a display unit for displaying information acquired by the image sensor. The photoelectric conversion apparatus may acquire information using information acquired by the image sensor, and the display unit may display information different from the information. The display unit may be exposed to the outside of the photoelectric conversion apparatus, or arranged within a viewfinder. The photoelectric conversion apparatus may be a digital camera or a digital video camera.

Figure 8A:
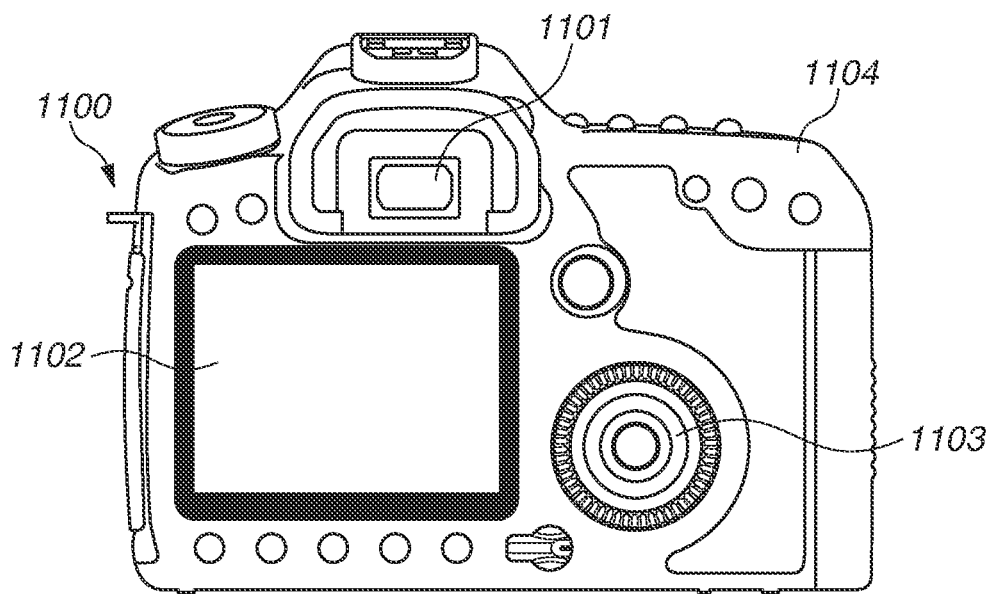
FIG. 8A is a schematic diagram illustrating an example of a photoelectric conversion apparatus according to the sixth exemplary embodiment.

FIG. 8A is a schematic diagram illustrating an example of a photoelectric conversion apparatus according to the present exemplary embodiment. A photoelectric conversion apparatus 1100 may include a viewfinder 1101, a back-surface display 1102, an operation unit 1103, and a casing 1104. The viewfinder 1101 may include the semiconductor apparatus 600 according to the first exemplary embodiment. Alternatively, the viewfinder 1101 may also be the display apparatus 1000 described in the present exemplary embodiment. In this case, the display apparatus may display not only a captured image but also environmental information and an image capturing instruction. The environmental information may include the intensity of outside light, the orientation of outside light, a speed at which a subject moves, and a possibility of a subject being shielded by a shielding object.

Since a timing suitable for image capturing is a small amount of time, it is desirable to display information as early as possible. Accordingly, it is desirable to use a display apparatus having the light emitting element 10, which uses an organic EL element as the light emitting element, according to the first or second exemplary embodiment. A reason of using this light emitting element is that an organic EL element has high response speed. The display apparatus using an organic EL element can be more desirably used in these apparatuses, which requires a high display speed, than a liquid crystal display apparatus.

The photoelectric conversion apparatus 1100 includes an optical unit (not illustrated). The optical unit includes a plurality of lenses, and forms an image onto an image sensor disposed in the casing 1104. By adjusting relative positions of the plurality of lenses, a focal point is adjusted. This operation can also be performed automatically.

The display apparatus according to the present exemplary embodiment may include color filters having colors of red, green, and blue. The color filter may have a color arrangement of the red, the green, and the blue in a delta array.

The display apparatus according to the present exemplary embodiment may be used as a display unit of a mobile terminal. In this case, the display apparatus may have both a display function and an operation function. Examples of the mobile terminal include a mobile phone such as a smartphone, a tablet, and a head-mounted display.

Figure 8B:
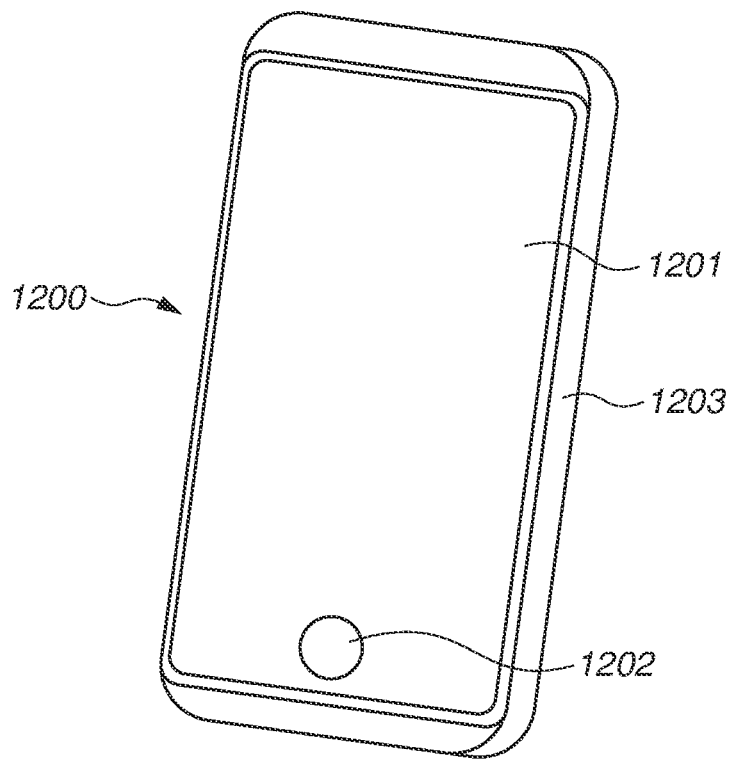
FIG. 8B is a schematic diagram illustrating an example of an electronic device according to the sixth exemplary embodiment.

FIG. 8B is a schematic diagram illustrating an example of an electronic device according to the present exemplary embodiment. An electronic device 1200 includes a display unit 1201, an operation unit 1202, and a casing 1203. The display unit 1201 includes the semiconductor apparatus 600 according to the first exemplary embodiment. The casing 1203 may include a circuit, a printed substrate having the circuit, a battery, and a communication unit. The operation unit 1202 may be a button or may be a touch panel type reaction unit. The operation unit 1202 may be a biometric authentication unit for unlocking the electronic device 1200 by recognizing a fingerprint. An electronic device including a communication unit can also be referred to as a communication device.

Figure 9A:
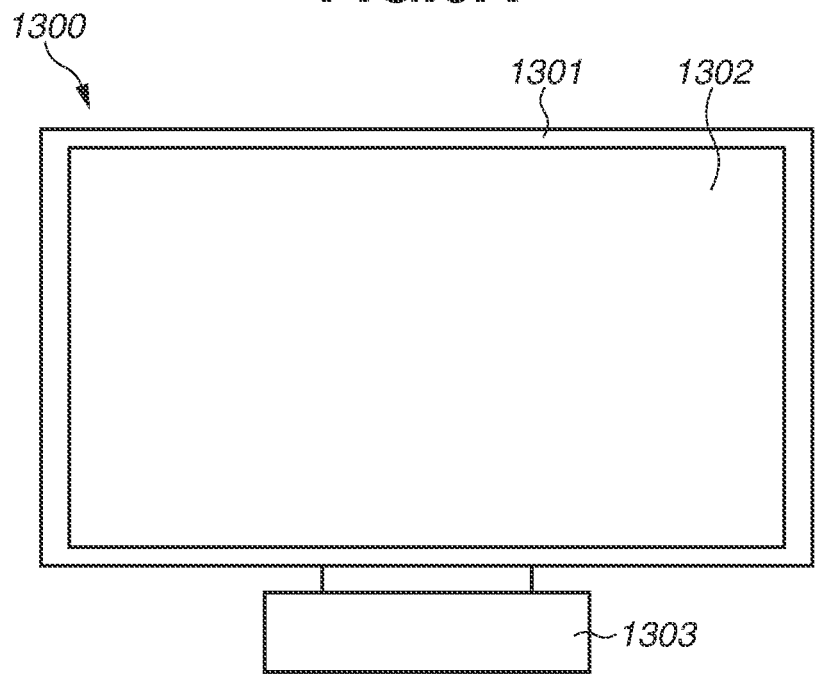
FIG. 9A is a schematic diagram illustrating an example of a display apparatus according to the sixth exemplary embodiment.
Figure 9B:
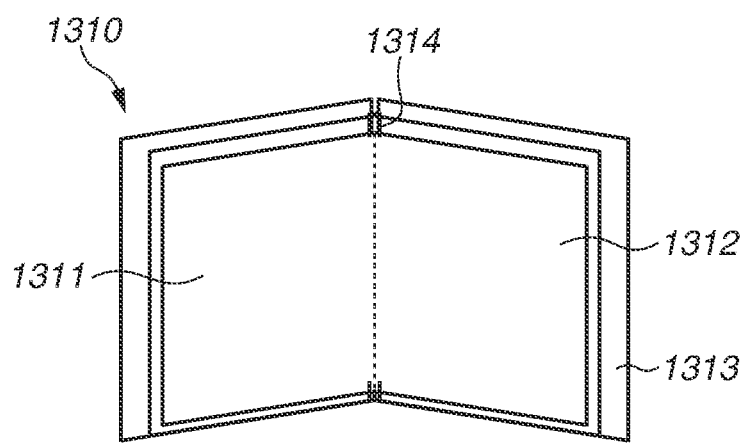
FIG. 9B is a schematic diagram illustrating an example of a foldable display apparatus according to the sixth exemplary embodiment.

FIGS. 9A and 9B are schematic diagrams each illustrating an example of the display apparatus according to the present exemplary embodiment. FIG. 9A illustrates a display apparatus, such as a television monitor, and a personal computer (PC) monitor. A display apparatus 1300 includes a frame 1301 and a display unit 1302. The semiconductor apparatus 600 according to the first exemplary embodiment may be used for the display unit 1302.

The display apparatus 1300 further includes a base 1303 supporting the frame 1301 and the display unit 1302. The shape of the base 1303 is not limited to the shape illustrated in FIG. 9A. A lower side of the frame 1301 may also serve as the base 1303.

The frame 1301 and the display unit 1302 may have a curved shape. The curvature radius of the curved shape may be 5000 mm or more and 6000 mm or less.

FIG. 9B is a schematic diagram illustrating another example of the display apparatus according to the present exemplary embodiment. A display apparatus 1310 illustrated in FIG. 9B has a foldable configuration, and is a so-called foldable display apparatus. The display apparatus 1310 includes a first display unit 1311, a second display unit 1312, a casing 1313, and a folding point 1314. The first display unit 1311 and the second display unit 1312 may include the semiconductor apparatus 600 according to the first exemplary embodiment.

The first display unit 1311 and the second display unit 1312 may form a seamless one display apparatus. The first display unit 1311 and the second display unit 1312 can be divided at the folding point 1314. The first display unit 1311 and the second display unit 1312 may individually display different images, or may display one image in cooperation.

Figure 10A:
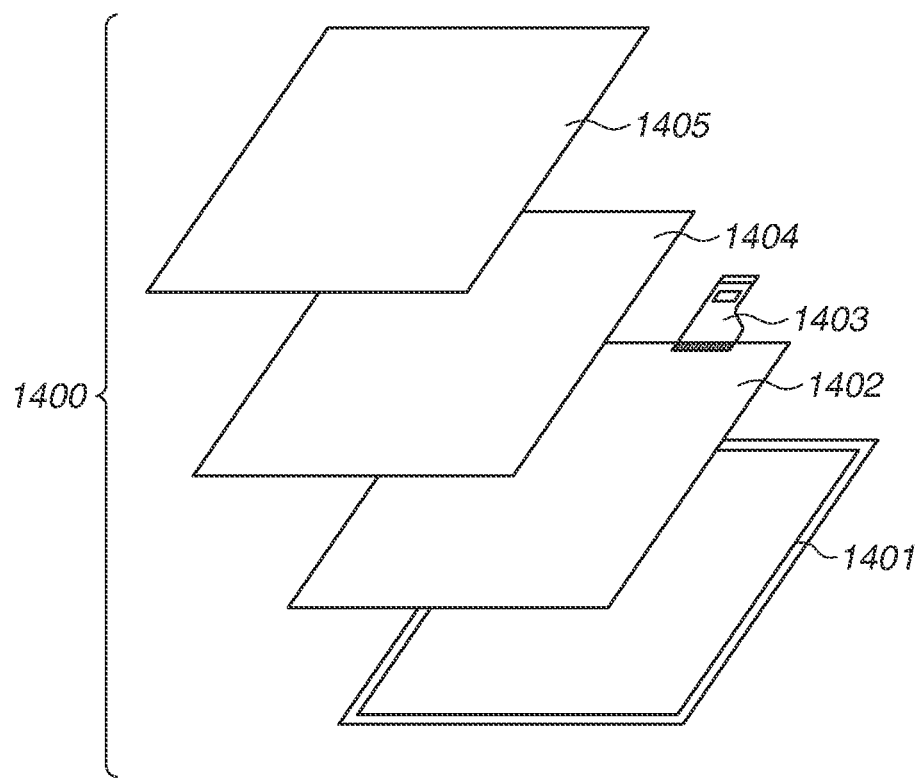
FIG. 10A is a schematic diagram illustrating an example of an illumination apparatus according to the sixth exemplary embodiment.

FIG. 10A is a schematic diagram illustrating an example of an illumination apparatus according to the present exemplary embodiment. An illumination apparatus 1400 may include a casing 1401, a light source 1402, a circuit substrate 1403, an optical filter 1404, and a light diffusion unit 1405. The light source 1402 may include the semiconductor apparatus 600 according to the first exemplary embodiment. The optical filter 1404 may be a filter that improves color rendering properties of the light source 1402. The light diffusion unit 1405 can efficiently diffuse light from the light source 1402 by lighting up, for example, and can deliver light to a wide range. The optical filter 1404 and the light diffusion unit 1405 may be provided on a light emission side of illumination. A cover may be provided as necessary at an outermost portion.

The illumination apparatus 1400 is configured to illuminate, for example, the inside of a room. The illumination apparatus 1400 may emit light in any color of white color, natural white color, and other colors from blue to red. The illumination apparatus 1400 may include a light control circuit for controlling these colors. The illumination apparatus 1400 may include the semiconductor apparatus 600 according to the first exemplary embodiment, and a power circuit connected to the semiconductor apparatus 600. The power circuit is configured to convert an alternating-current voltage into a direct-current voltage. In here, the white color has a color temperature of 4200 K, and the natural white color has a color temperature of 5000 K. The illumination apparatus 1400 may include a color filter.

The illumination apparatus 1400 according to the present exemplary embodiment may include a heat release unit. The heat release unit is configured to release heat in the illumination apparatus 1400 to the outside of the apparatus. Material for the heat release unit may be a metal with high specific heat or liquid silicon.

Figure 10B:
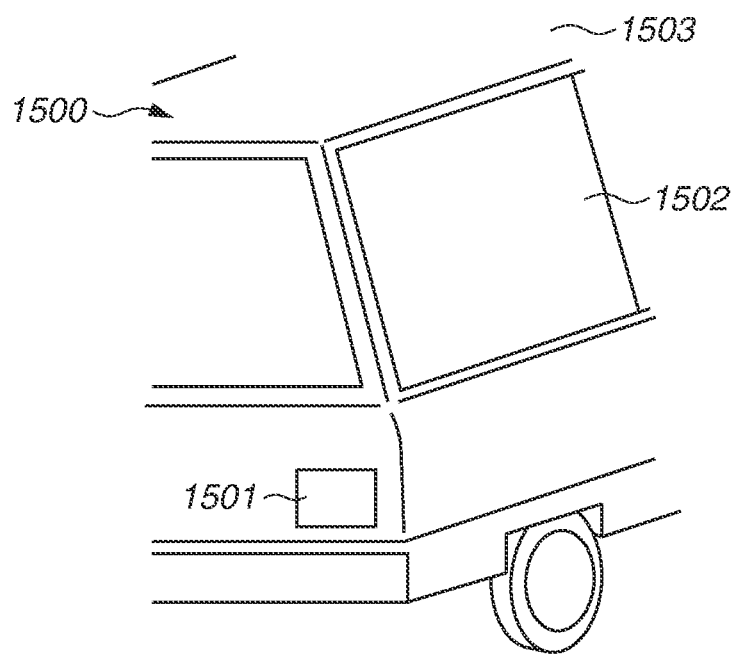
FIG. 10B is a schematic diagram illustrating an example of an automobile having an in-vehicle illumination device according to the sixth exemplary embodiment.

FIG. 10B is a schematic diagram illustrating an automobile serving as an example of a moving body according to the present exemplary embodiment. The automobile includes a tail lamp serving as an example of an illumination device. An automobile 1500 may include a tail lamp 1501. The automobile 1500 may be configured to light the tail lamp 1501, for example, when a brake operation is performed.

The tail lamp 1501 may include the semiconductor apparatus 600 according to the first exemplary embodiment. The tail lamp 1501 may include a protection member for protecting a light emitting element. Material of the protection member is not limited as long as the material is transparent and has a certain level of high strength, but polycarbonate or the like is desirably used. A furandicarboxylic acid derivative or an acrylonitrile derivative may be mixed with polycarbonate.

The automobile 1500 may include a vehicle body 1503 and a window 1502 attached to the vehicle body 1503. The window 1502 may also be a transparent display as long as the window 1502 is not used for checking the front side and the back side of the automobile 1500. The transparent display may include the semiconductor apparatus 600 according to the first exemplary embodiment. In this case, a transparent member is used as a constituent material of an electrode included in the semiconductor apparatus 600.

Examples of the moving body according to the present exemplary embodiment may include a ship, an airplane, and a drone. The moving body may include a fuselage and an illumination device provided on the fuselage. The illumination device may emit light for reporting the position of the fuselage. The illumination device includes the semiconductor apparatus 600 according to any of the first to fourth exemplary embodiments.

As described above, by using the semiconductor apparatus 600 according to any of the first to fourth exemplary embodiments, display with high reliability can be achieved.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A semiconductor apparatus comprising:
    an element substrate including an effective pixel region having a plurality of effective pixels on one principal surface of a first substrate, and a peripheral region positioned around the effective pixel region;
    a second substrate; and
    a first bonding member and a second bonding member configured to bond the element substrate and the second substrate,
    wherein the element substrate comprises a first insulating layer,
    wherein a first wiring, a second wiring, and an external connection terminal are provided over and in contact with the first insulating layer,
    wherein the second bonding member contains a material different from a material of the first bonding member,
    wherein the first bonding member is disposed between the peripheral region and the second substrate,
    wherein the second bonding member is provided between the effective pixel region and the second substrate,
    wherein, in a planar view with respect to the one principal surface, the first wiring is overlapped with the second bonding member,
    wherein the second wiring is overlapped with the first bonding member, and
    wherein, in a planar view with respect to the one principal surface, the second bonding member extends up to a portion of the element substrate that is not overlapped with the second substrate.

2. The semiconductor apparatus according to claim 1, wherein at least one of the first bonding member and the second bonding member is provided over a region having an area of ⅓ or more of an area of a region of the element substrate that does not overlap the second substrate, in a planar view with respect to the one principal surface.

3. The semiconductor apparatus according to claim 1, wherein an external connection terminal is disposed on the element substrate,
    wherein a structural member is disposed in a portion of the element substrate that does not overlap the second substrate in a planar view with respect to the one principal surface, and
    wherein the structural member is disposed between the second bonding member and the external connection terminal in a planar view with respect to the one principal surface.

4. The semiconductor apparatus according to claim 3, wherein at least one of the first bonding member, the second bonding member, and the structural member is disposed in a region having an area of ⅓ or more of an area of a region of the element substrate that does not overlap the second substrate and excludes the external connection terminal in a planar view with respect to the one principal surface.

5. The semiconductor apparatus according to claim 1, wherein the first bonding member contains a spacer.

6. The semiconductor apparatus according to claim 5, wherein a particle diameter of the spacer contained in the first bonding member is 1 to 50 μm.

7. The semiconductor apparatus according to claim 3, wherein the structural member has a thickness of double or more of a particle diameter of the spacer.

8. The semiconductor apparatus according to claim 1, wherein the second bonding member does not contain a spacer.

9. The semiconductor apparatus according to claim 1, wherein an elasticity modulus of the first bonding member is higher than an elasticity modulus of the second bonding member.

10. The semiconductor apparatus according to claim 1, wherein an elasticity modulus of the first bonding member is 500 MPa or more.

11. The semiconductor apparatus according to claim 1, wherein an elasticity modulus of the second bonding member is 100 MPa or less.

12. The semiconductor apparatus according to claim 1, wherein the first bonding member covers a part of a side surface of the second substrate.

13. The semiconductor apparatus according to claim 1, wherein, in a planar view with respect to the one principal surface, the second substrate is disposed within the element substrate.

14. The semiconductor apparatus according to claim 1, wherein, in a planar view with respect to the one principal surface, the element substrate has a polygonal shape, and
    wherein the first bonding member includes two portions separated at a corner portion of the second substrate.

15. The semiconductor apparatus according to claim 1, wherein a second insulating layer covering at least a part of the peripheral region and the effective pixel region is disposed, and
    wherein the first bonding member is provided on the second insulating layer in a portion of the element substrate that does not overlap the second substrate in a planar view with respect to the one principal surface.

16. The semiconductor apparatus according to claim 1, wherein at least one of the plurality of effective pixels includes an organic electroluminescence (EL) element, and a transistor connected to the organic EL element.

17. A photoelectric conversion apparatus comprising:
    an optical unit including a plurality of lenses;
    an image sensor configured to receive light having passed through the optical unit; and
    a display unit configured to display an image captured by the image sensor,
    wherein the display unit includes a semiconductor apparatus according to claim 1.

18. An electronic device comprising:
    a display unit including a semiconductor apparatus according to claim 1.

19. An illumination apparatus comprising:
    a light source including the semiconductor apparatus according to claim 1; and
    a light diffusion unit configured to let through light emitted by the light source or an optical filter configured to let through light emitted by the light source,
    wherein at least one of the plurality of effective pixels includes an organic EL element.

20. A moving body comprising:
    an illumination device including the semiconductor apparatus according to claim 1; and a fuselage on which the illumination device is provided,
wherein at least one of the plurality of effective pixels includes an organic EL element.

\* \* \* \* \*